United States Patent [19]

McGarrity et al.

[11] 4,323,842
[45] Apr. 6, 1982

[54] METHOD AND APPARATUS FOR ELECTRICALLY TESTING RADIATION SUSCEPTIBILITY OF MOS GATE DEVICES

[75] Inventors: James M. McGarrity, Silver Spring; Harold E. Boesch, Jr., Columbia, both of Md.

[73] Assignee: The United States of America as represented by the Secretary of the Army, Washington, D.C.

[21] Appl. No.: 122,208

[22] Filed: Feb. 19, 1980

[51] Int. Cl.³ .............................................. G01R 31/26
[52] U.S. Cl. ............................. 324/158 R; 324/158 D
[58] Field of Search ........... 324/158 R, 158 D, 158 T, 324/51; 250/370, 371, 492 A

[56] References Cited

PUBLICATIONS

Sze, S. M.; "Physics of Semiconductor Devices"; Wiley-Interscience, New York, N.Y.; 1969; pp. 477-479.
Aitken et al.; "Avalanche . . . "; IEEE Trans. on Nuc. Sci.; vol. NS-24; No. 6; Dec. 1977; pp. 2128-2134.

Primary Examiner—Ernest F. Karlsen
Attorney, Agent, or Firm—Nathan Edelberg; Robert P. Gibson; Saul Elbaum

[57] ABSTRACT

A method and apparatus are disclosed for testing susceptibility of a gate insulator in MOS and MIS devices to irradiation without use of ionizing radiation. The method consists of simulating the effects of radiation by applying a high magnitude, pulsed electric field to the device under test. An apparatus capable of determining the relationship between voltage applied to the device under test and the device capacitance is used to provide the desired susceptibility information.

8 Claims, 8 Drawing Figures

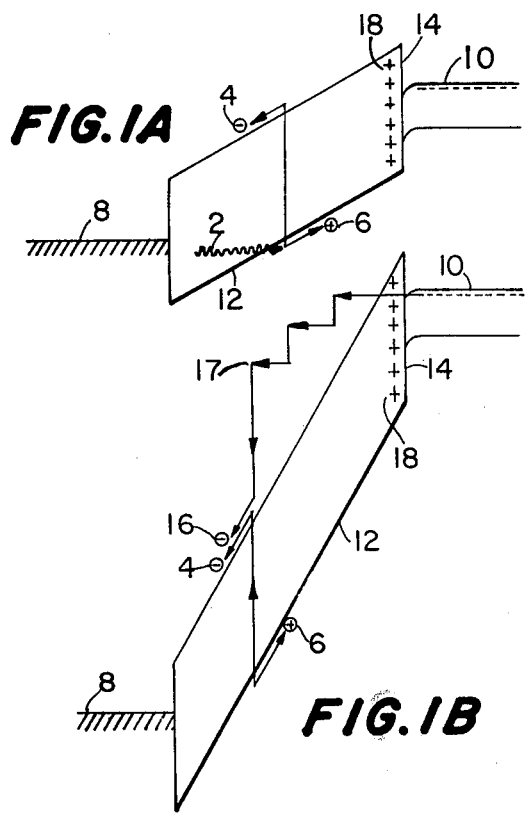
FIG. 1A
FIG. 1B
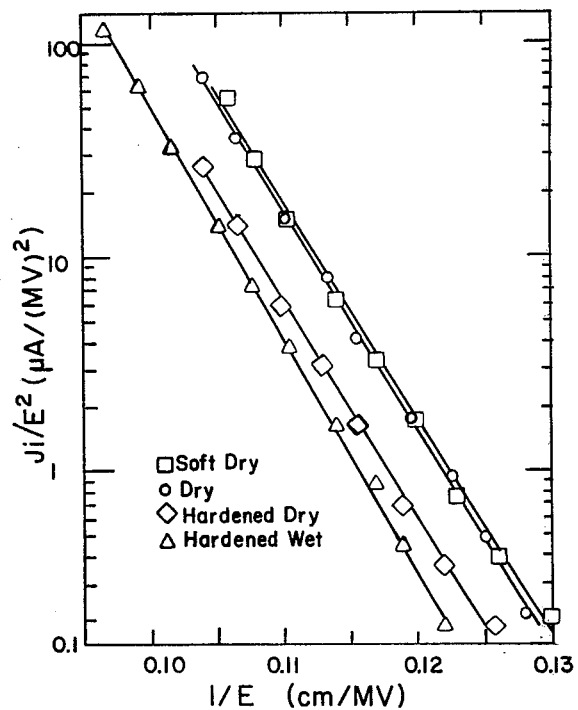
FIG. 4
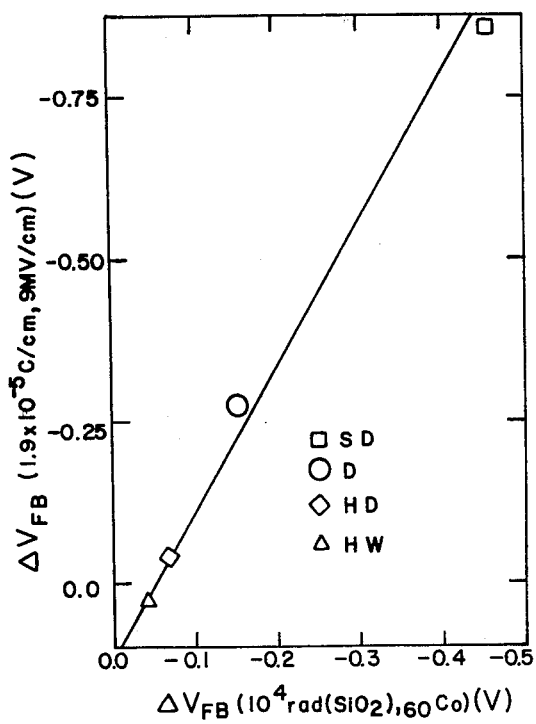
FIG. 5
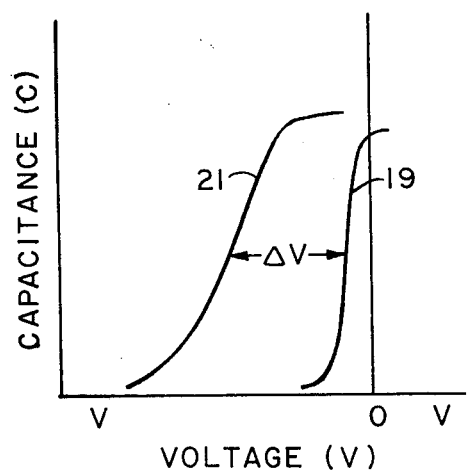
FIG. 2

METHOD AND APPARATUS FOR ELECTRICALLY TESTING RADIATION SUSCEPTIBILITY OF MOS GATE DEVICES

RIGHTS OF THE GOVERNMENT

The invention described herein may be manufactured, used, and licensed by or for the United States Government for governmental purposes without the payment to me of any royalty thereon.

BACKGROUND OF THE INVENTION

1. Field of the Invention

The invention relates to testing devices, and more particularly to method and apparatus for testing the effects of irradiation on metal-oxide-semiconductor devices.

2. Prior Art

In the manufacture of metal-oxide-semiconductor (MOS) or metal-insulator-semiconductor (MIS) integrated circuits it is frequently desirable to determine whether the manufactured devices meet certain military specifications for radiation survivability, or hardness. Such hardness testing currently typically involves actual exposure to radiation at an irradiation facility and thus does not permit the devices to be tested on the manufacturing line.

Alternatives to this form of testing have been suggested, and include the use of an electron beam, generated by a scanning electron microscope, to irradiate the device under test and to observe the device response. This procedure, however, must be performed in a vacuum chamber, is slow and inconvenient, and requires an expensive electron microscope, all of which increases the expense involved in performing the desired test.

Still another alternative utilizes high field avalanche injection of holes into the silicon dioxide insulator from the silicon substrate to simulate radiation, as discussed in Aitken and Young, "*Avalanche Injection of Holes in $SiO_2$*", IEEE Trans. Nucl. Sci., Volume NS-24, page 2128, December 1977. Use of this approach requires a heavily doped silicon substrate, which is not typically available on MOS integrated circuits. Further, since holes are injected under a negative bias and a heavily doped substrate is used, the measurement is relatively insensitive to hole trapping at the insulator-semiconductor interface and to interface state buildup, which are the most important parts of the radiation response.

SUMMARY AND OBJECTS OF THE INVENTION

It is accordingly a primary object of the present invention to provide a method and apparatus for hardness testing of MOS and MIS devices which overcomes the deficiencies of the prior art.

It is a more specific object of the invention to provide a hardness-testing method and apparatus which are substantially independent of irradiation.

Still more specifically, it is an object of the invention to provide a method and apparatus for testing MOS devices for susceptibility to irradiation utilizing a change in the capacitance-voltage curve for the device under test in response to a pulsed high electric field.

In accordance with the present invention, predetermined numbers of high voltage pulses are applied to a device under test, and the charge accumulated by the device in response to the pulses is monitored. A capacitance-voltage curve for the device is obtained and the device susceptibility to irradiation deduced therefrom.

These and other objects, features, and advantages of the present invention will become more readily apparent from the following specification and appended claims, when considered in conjunction with the attached drawings.

BRIEF DESCRIPTION OF THE DRAWINGS

FIGS. 1A and 1B are energy diagrams showing the effects of ionizing irradiation and of impact ionization;

FIG. 2 shows a typical change in a capacitance-voltage characteristic of an MOS capacitor in response to external ionizing radiation;

FIG. 4 shows the dependence of injected current on the pulsed field in the oxide;

FIG. 5 illustrates the correlation between a pulsed high-field induced flat band voltage shift and a radiation induced shift in MOS capacitors;

DETAILED DESCRIPTION OF THE PREFERRED EMBODIMENT

Figure 3:
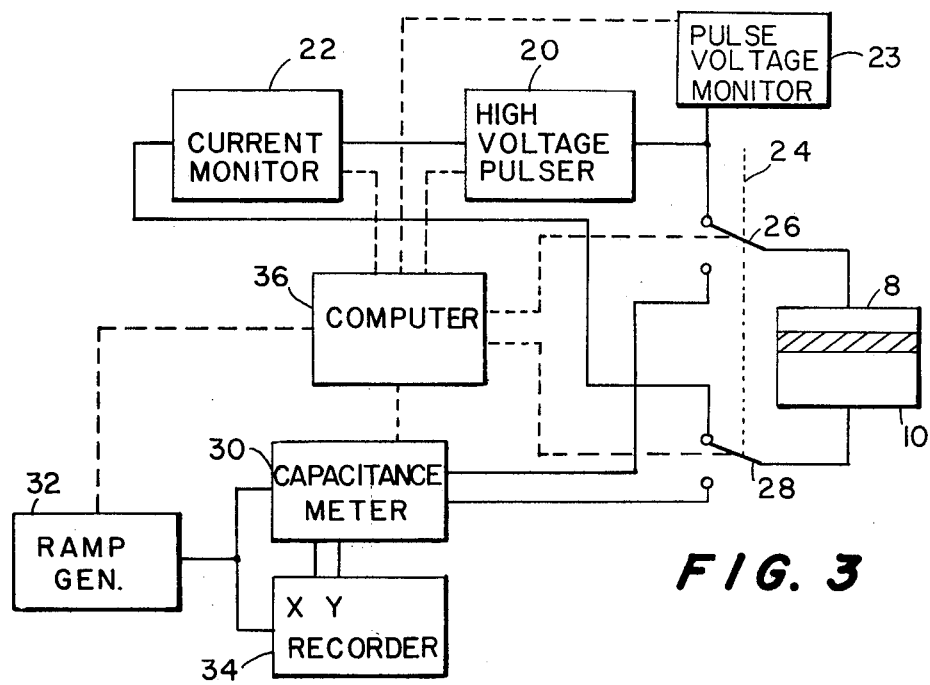
FIG. 3 shows the apparatus of the present invention.

By way of background illustration, the effects of ionizing radiation on the energy structure within an MOS device is shown in FIG. 1a. Therein it is seen that, under the bulk ionization effects of X-rays or other irradiation, a photon or high energy electron 2 penetrates the insulator. An ionization event occurs generating an electron hole pair, the electron shown at 4 and the positively charged hole at 6. Where ionizaton occurs under positive bias conditions, the bulk-generated electrons drift toward the positively charged metal gate, 8, while the holes transport toward the negatively charged silicon substrate shown at 10. As discussed in Bakowski et al, "*Trapping Effect in Irradiated and Avalanche Injected MOS Capacitors*", IEEE Trans. Nucl. Sci., Volume NS-25, No. 6, December 1978, the interaction of the holes with the traps may result in an accumulation of a positive charge 18, as shown in FIG. 1a at interface 14.

Creation of such a trapped charge degrades the operating characteristics of the device. Specifically, the operating voltage will change, potentially leading to a result wherein the device might be permanently in the "on" condition. In order to test the susceptibility of the device to such effects it has previously been necessary to irradiate the device and to detect any degradation which results in its operating characteristics.

The present method of field-induced injection and impact ionization is illustrated in FIG. 1b, wherein an electron 16 is injected into the insulating silicon dioxide layer 12 from silicon substrate 10. As is seen from the path of the electron, the electron randomly loses its kinetic energy by collisions and other interactions. Such losses are indicated by downward steps in the electron's energy level as it progresses further into the insulating layer. The electron also gains kinetic energy from its forward progression in the electric field. At a point 17 an impact ionization event takes place, where the electron imparts sufficient energy at a point in the lattice structure to create an electron-hole pair. From that point on the behavior of the resultant electron 4 and hole 6 is similar to that of an electron-hole pair generated by ionizing radiation. As in the case of exposure to radiation, positive charge 18 may build up at the interface 14 between insulator 12 and substrate 10.

Changes in the turn-on voltage of an MOS device, whether occasioned by ionizing radiation as in FIG. 1a or by high-field induced impact ionization as in FIG. 1b leads to shifts in the capacitance voltage curve for the device. Such curves generally convey information about the operating characteristics of a device as disclosed in the textbook "Physics of Semiconductor Devices", S.N. Sze, Wylie, 1969 at chapter 9. A shift of the capacitance-voltage curve in response to radiation is discussed in the text at chapter 10, for example.

The present invention is based on a determination that comparable, proportional shifts in the capacitance-voltage curve may be effected by exposure to a pulsed high electric field, thereby eliminating the need for exposure to radiation to determine the quantitative or qualitative response of the device to ionizing radiation.

A typical shift in the C-V (capacitance-voltage) characteristic of an MOS device is shown in FIG. 2. The figure specifically shows C-V curves 19 and 21, obtained before and after irradiation (or high field electron injection), respectively. The curves illustrate a flat band voltage shift, $\Delta V$, which is seen to occur as a result of irradiation of the device. A further change in the C-V curve, specifically the curve shape and slope at various points, is exaggerated in the figure. As is known to those skilled in the art, the slope of the C-V curve is related to the gain of the MOS device. The changes in slope and location of the curve thus convey information pertinent to the change in gain and operability of the device.

The inventive apparatus simulates the effect of radiation by creation of electron-hole pairs in the insulating layer via impact ionization by electrons injected into the insulating layer from the substrate.

Figure 7:
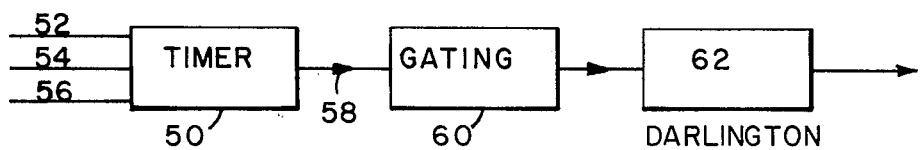
FIG. 7 illustrates a circuit which may be used as pulsing means 20 of FIG. 3.

As shown in FIG. 3, a high voltage pulsing means, shown at 20, generates high voltage flat-topped, short duration pulses. Typical pulse lengths may be 5 microseconds to 50 microseconds, although pulses with durations of 0.5 microseconds to 1 millisecond are similarly contemplated, with the range being further extendable to compensate for differing thicknesses of oxide and other conditions which may vary in the different devices under test. The pulses are preferably chosen to provide a field having a magnitude in the range of 8–10 MV/cm. Typical pulses may have magnitudes in the range of 50 to 200 volts. Pulsing means 20 may be obtained as an Analog Devices Type 171 high voltage amplifier. Alternatively, a non-saturating darlington circuit may be gated by a pulse generator including a type 555 timer, as shown in FIG. 7.

The present invention provides a pulsed rather than a continuous field in order to avoid deterioration or destruction of the device, a result which may occur under continuous fields of the high magnitude contemplated herein. Further, because of the extreme sensitivity of the injection process to the field amplitude, the pulses generated by pulsing means 20 are preferably extremely flat.

The electric field generated by pulsing means 20 is measured by voltage monitor means 23 and is used to inject a controlled amount of charge into the substrate, and a current monitor 22 is utilized for observing and controlling the injected current. An Analog Devices Type 50J high speed differential amplifier, connected in the inverting mode as a current to voltage amplifier, may be used as part of monitor 22.

The high voltage pulses are applied to the gate electrode via a mode switch 24, comprising a pair of ganged single-pole-double-throw switches 26 and 28. Switch 26 connects the positive pulses to the gate electrode while switch 28 connects the ground side of pulsing means 20, through current monitor 22, to substrate 10.

The mode switch 24 is used to switch between the pulse injection mode and the C-V measurement mode. Upon activation of the switch to the downward position shown in FIG. 3, it is seen that a capacitance meter 30 is connected across the device under test. The meter may be a Boonton model 71R capacitance meter.

A ramp voltage source 32 is used to provide a voltage to capacitance meter 30, and to an XY recorder 34. The ramp voltage is specifically applied to the X input of recorder 34. In operation the meter provides an output to the XY recorder which then provides a graphical record of the capacitance-voltage curve.

The concept of displaying a capacitance-voltage characteristic of a device is disclosed in ISA Transactions, Volume 10, No. 2, pages 204–215, 1971, Kopp, Williamson and Grannemann, "*Instrumentation Providing Automated Data for Use in Metal-Insulator-Semiconductor Interface Studies*", presented at the fifth annual ISA Symposium, Albuquerque, N. Mex., Jan. 22, 1970.

The number of holes trapped at interface 14 is a particular percentage of the holes generated by impact ionization in response to the pulsed electric field. The number of generated holes is typically known for particular conditions of the applied electric field and device geometry. Thus, the shift in the capacitance-voltage curve, determined by the number of trapped holes, may be generated by exposure of the device under test to the high electric field. The shift is a function of the total injected charge and may be used as an indication of device operating quality in response to irradiation. The extent of the shift may be used in a go/no go test indicative of applicability of certain devices in environments having particular radiation levels. Similarly, device vulnerability to radiation damage may be determined by the amount of the shift to permit classification of devices for use in predetermined radiation environments.

While the preceding specification contemplates a graphical output from recorder 34, for evaluation by an operator, it is clear that the operator may be automated. That is, computing devices may be utilized to control the test in response to signals from current monitor 22, voltage monitor 23, and from capacitance meter 30. The mini computer controller, shown dashed at 36, may be preprogrammed to classify devices under test without providing any display of the C-V characteristic shift. The computer may, however, be programmed to provide a display for each device under test.

It is recognized that a theoretical explanation for the operation of the device is not necessary. However, for clarity to the reader, the inventors present their conclusion that electrons are injected into the gate oxide via Fowler-Nordheim tunneling from the silicon substrate during the application of the high pulsed field. Results of experiments conducted on several types of MOS devices are shown in FIG. 4, which is a Fowler-Nordheim plot of the dependence of the injected current per unit area, $J_i$, upon the pulsed field E in the oxide of each of the sample types. The linear relationships and the values of the essentially equal slopes of the curves indicate that the current injection process is indeed Fowler-Nordheim tunneling of electrons from the conduction band of the silicon substrate into the conduction band of the silicon dioxide insulator as shown in FIG. 1b.

In the oxide, the injected electrons drift under the effects of the pulsed field. At fields above approximately 8 MV/cm a small fraction of the electrons acquire enough energy (approximately 9 eV) between scattering events to produce electron-hole pairs by impact ionization. In the figure, the gate oxide samples used consist of silicon dioxide layers grown on 1–5 ohm-cm n-type silicon. SD is a commercial type dry thermally grown product; D is a moderately radiation-tolerant dry-grown oxide; HD is a radiation-hard dry-process product; and HW is a hard pyrogenic $H_2O$ wet-process oxide.

To determine a correlation between the effects of the present method of field induced injection and impact ionization (FI4) and ionization radiation on the MOS devices, the four sample types were irradiated to doses of $10^4$ and $10^5$ rad ($SiO_2$). Similar samples were subjected to the present treatment at $9 \times 10^6$ V/cm for equal injected electron fluences. The $Co^{60}$ irradiation flat band shifts were normalized to 10 krad ($SiO_2$); both the $Co^{60}$ and the results from the present method were then normalized to 1000 Angstrom oxide thickness using an oxide-thickness-squared dependence. The results are plotted in FIG. 5. The correlation between the cobalt irradiation and the pulsed field results is clearly good for these materials in which the hole trapping fractions vary from 2 percent (HW) to 16 percent (SD). Based on the SD results, approximately 1 percent of the injected electrons cause impact ionization at 9 MV/cm, in agreement with results previously published by Solomon, Solid State Comm. Vol. 17, page 1397 (1975).

Figure 6:
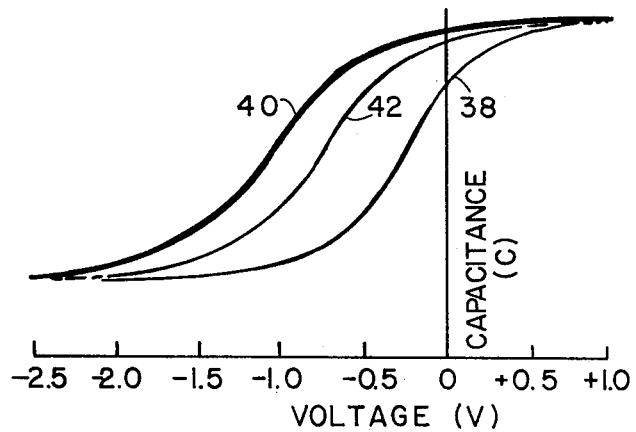
FIG. 6 shows a set of capacitance-voltage traces for an MOS capacitor.

FIG. 6 shows a set of capacitance-voltage curves recorded for an SD sample before and after field induced injection and impact ionization at a field of 9 MV/cm. The C-V curves are seen to be shifted to the left after each series of high voltage pulses due to the net hole trapping in the oxide. The change in flat band voltage after 1500 pulses is observed to be −0.78 V as seen from curves 38 and 40. Curve 38 represents the initial curve and curve 40 the curve after 1500 total pulses. Also shown is curve 42, illustrating the C-V characteristic after 800 pulses.

It is thus seen that, by applying a pulsed high electric field to a MOS device, under controlled circumstances, including the step of monitoring the amount of injected charge, it is possible to obtain an indication of shift in C-V characteristic for the device. Recording of the shift in characteristic may be achieved by utilizing a capacitance meter and an XY plotter. The testing method may provide for a display rather than recordation of the characteristic curve. Evaluation of the shift in C-V characteristic thus provides an indication of the radiation sensitivity or resistance of the device.

FIG. 7 shows a specific circuit which may be used to provide the desired pulses generated in FIG. 3 by pulsing means 20. Specifically, a timer 50 receives input signals indicative of the desired rate, duration, and mode (i.e., single or repetitive) on input leads 52, 54 and 56, respectively. The timer outputs its signal on lead 58 to control gating circuitry 60, comprised of high current buffers. Gates 60 are used to control an emitter follower darlington circuit 62 by turning the same on and off to provide the desired pulses. The amplitude of the pulses output by darlington circuit 62 is controlled by the power supply to the darlington circuit (not shown).

It is appreciated that the present technique may be used in conjunction with other electronic devices than those disclosed herein, and is accordingly not necessarily limited only to MOS or MIS devices.

We wish it to be understood that we do not desire to be limited to the exact details of construction shown and described, for obvious modifications can be made by a person skilled in the art.

What is claimed is:

1. A method for electrically testing radiation susceptibility of an MOS gate device which comprises a silicon substrate, an insulating silicon dioxide layer and a metal gate comprising the steps of:
   injecting a controlled number of electrons into said insulating silicon dioxide layer from said silicon substrate; and
   measuring a shift in a capacitance-voltage characteristic of said device.

2. A method, as recited in claim 1, wherein the step of injecting comprises:
   causing said electrons to be injected into said silicon dioxide by Fowler-Nordheim tunneling wherein a portion of said electrons form electron-hold pairs in said silicon dioxide by impact ionization.

3. A method, as recited in claim 2, wherein the step of causing said electrons to be injected into said silicon dioxide comprises:
   applying flat topped, short duration positive voltage pulses to said gate.

4. A method, as recited in claim 3, wherein said applying step provides a field magnitude of 8–10 MV/cm.

5. An apparatus for electrically testing radiation susceptibility of MOS gate devices which comprise a silicon substrate, an insulating silicon dioxide layer and a metal gate comprising:
   means for injecting a controlled number of electrons into said insulating silicon dioxide layer from said silicon substrate; and
   means for measuring a shift in a capacitance-voltage characteristic of said device.

6. An apparatus, as recited in claim 5, wherein said means for injecting electrons comprise means for injecting said electrons into said silicon dioxide by Fowler-Nordheim tunneling wherein a portion of said electrons form electronhole pairs in said silicon dioxide by impact ionization.

7. An apparatus, as recited in claim 6, wherein said means for injecting electrons comprises means for applying flat topped, short duration positive voltage pulses to said gate.

8. An apparatus, as recited in claim 7, wherein said positive voltage pulses provide a field magnitude of 8–10 MV/cm.

* * * * *